(12) United States Patent
Nilsson et al.

(10) Patent No.: US 10,484,022 B2
(45) Date of Patent: Nov. 19, 2019

(54) WIRELESS COMMUNICATION NODE WITH MULTI-BAND FILTERS

(71) Applicant: Telefonaktiebolaget LM Ericsson (publ), Stockholm (SE)

(72) Inventors: Andreas Nilsson, Göteborg (SE); Sven Petersson, Sävedalen (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 15/758,917

(22) PCT Filed: Oct. 14, 2015

(86) PCT No.: PCT/EP2015/073805
§ 371 (c)(1),
(2) Date: Mar. 9, 2018

(87) PCT Pub. No.: WO2017/063689
PCT Pub. Date: Apr. 20, 2017

(65) Prior Publication Data
US 2019/0044547 A1    Feb. 7, 2019

(51) Int. Cl.
*H04M 1/00* (2006.01)
*H04B 1/00* (2006.01)
*H04B 1/04* (2006.01)
*H04B 1/40* (2015.01)

(52) U.S. Cl.
CPC ........... *H04B 1/005* (2013.01); *H04B 1/0475* (2013.01); *H04B 1/40* (2013.01); *H04B 2001/0408* (2013.01)

(58) Field of Classification Search
CPC ........ H04B 1/005; H04B 1/0475; H04B 1/40; H04B 2001/0408

USPC ........................................................ 455/575.7
See application file for complete search history.

(56) References Cited

U.S. PATENT DOCUMENTS

2008/0293451 A1* 11/2008 Haskell ............... H04B 7/0491
455/562.1
2013/0090080 A1   4/2013 Schmidt
2015/0035599 A1   2/2015 Chow et al.

FOREIGN PATENT DOCUMENTS

EP         0 511 555 A1    11/1992

OTHER PUBLICATIONS

International Search Report and Written Opinion of the International Searching Authority for PCT/EP2015/073805 dated Jun. 14, 2016, 10 pages.

* cited by examiner

*Primary Examiner* — Huy C Ho
(74) *Attorney, Agent, or Firm* — Sage Patent Group

(57) ABSTRACT

The present disclosure relates to a wireless communication network node comprising at least one antenna arrangement, at least one radio arrangement, at least one power splitter arrangement and at least one power amplifier. Each antenna arrangement comprises at least one antenna device, and each power splitter arrangement comprises an input port and at least two output ports. Each of said at least one power amplifier is connected to a corresponding input port, and, for each power splitter arrangement, at least two output ports are connected to at least one corresponding antenna device via a corresponding multi-band filter for each of said output ports. Each multi-band filter is arranged for at least two frequency bands.

18 Claims, 4 Drawing Sheets

WIRELESS COMMUNICATION NODE WITH MULTI-BAND FILTERS

CROSS REFERENCE TO RELATED APPLICATION

This application is a 35 U.S.C. § 371 national stage application of PCT International Application No. PCT/EP2015/073805, filed on Oct. 14, 2015, the disclosure and content of which is incorporated by reference herein in its entirety.

TECHNICAL FIELD

The present disclosure relates to a wireless communication network node, where the node comprises at least one antenna arrangement, at least one radio arrangement, at least one power splitter arrangement and at least one power amplifier.

BACKGROUND

In a wireless communication networks, there are communication nodes, for example base stations, where base station products are provided by different suppliers. Today there is typically one base station product per frequency band. In the future the number of frequency bands is expected to grow rapidly, which would require a lot of different base station products supported by each supplier. Each base station product is expensive to develop and to service, which will make it very costly to have a plurality of different base station products.

One way for reducing the number of base station products is to design multiband base stations, which means that one base station product could be used for many different frequency bands. One essential part of a multiband base station is multiband filters, which is used to filter the signals before they are transmitted/received. However, multiband filters can only be designed for relatively low signal power levels, which makes it difficult to use them for transmission in macro and micro base stations.

In base stations, there is usually one filter per transmitter radio arrangement, where a transmitter radio arrangement comprises one or more power amplifiers. By increasing the number of transmitter radios arrangements, it is possible to reduce the output power per radio and hence the power going through the corresponding filters. With large enough number of transmitter radio arrangements, it is then possible to reduce the power per filter such that multiband filters are enabled. However, such an arrangement would be rather costly due to the larger number of transmitter radio arrangements.

There is thus a need for a multi-band communication node where the number of transmitter radio arrangements is not increased compared to a single-band communication node.

SUMMARY

It is an object of the present disclosure to provide a multi-band communication node where the number of transmitter radio arrangements is not increased compared to a single-band communication node.

Said object is obtained by means of a wireless communication network node comprising at least one antenna arrangement, at least one radio arrangement, at least one power splitter arrangement and at least one power amplifier. Each antenna arrangement comprises at least one antenna device, and each power splitter arrangement comprises an input port and at least two output ports. Each power amplifier is connected to a corresponding input port, and, for each power splitter arrangement, at least two output ports are connected to at least one corresponding antenna device via a corresponding multi-band filter for each of said output ports. Each multi-band filter is arranged for at least two frequency bands.

According to an example, at least two multi-band filters are connected to said antenna device via a corresponding phase shifter.

According to another example, the communication network node comprises a first power amplifier, a second power amplifier, a first power splitter arrangement and a second power splitter arrangement. The first power amplifier is connected to an input port of the first power splitter arrangement and the output ports of the first power splitter arrangement are connected to a first set of antenna devices of a combined antenna arrangement via corresponding multi-band filters and phase shifter. The second power amplifier is connected to an input port of the second power splitter arrangement. Furthermore, the output ports of the second power splitter arrangement are connected to a second set of antenna devices of the combined antenna arrangement via corresponding multi-band filters and phase shifters. The combined antenna arrangement comprises antenna devices of a first polarization and a second polarization, where first polarization is orthogonal to the second polarization.

According to another example, the first set of antenna devices comprises antenna devices of the first polarization only, and where the second set of antenna devices comprises antenna devices of the second polarization only. Alternatively, the first set of antenna devices comprises antenna devices of both the first polarization and the second polarization, and where the second set of antenna devices comprises antenna devices of both the first polarization and the second polarization.

According to another example, a first combined polarization resulting from the first set of antenna devices is orthogonal to a second combined polarization resulting from the second set of antenna devices.

According to another example, one or more multi-band filters are arranged to separate frequency components of a signal and pass certain selected frequency ranges while filtering out other frequency ranges, thus being arranged to divide a frequency spectrum into a series of pass bands and stop bands separated by transition bands.

More examples are disclosed in the dependent claims.

A number of advantages are obtained by means of the present disclosure. Mainly a multi-band communication node is obtained, where the number of transmitter radio arrangements is not increased compared to a single-band communication node.

BRIEF DESCRIPTION OF THE DRAWINGS

The present disclosure will now be described more in detail with reference to the appended drawings, where.

DETAILED DESCRIPTION

Figure 1:
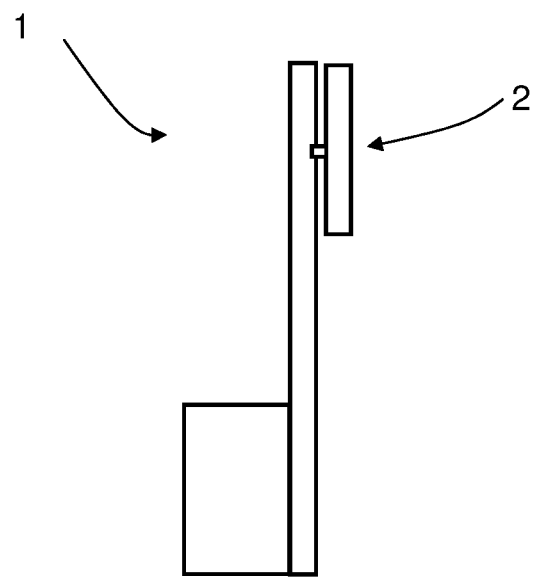
FIG. 1 shows a schematic side view of a node in a wireless communication network.
Figure 2:
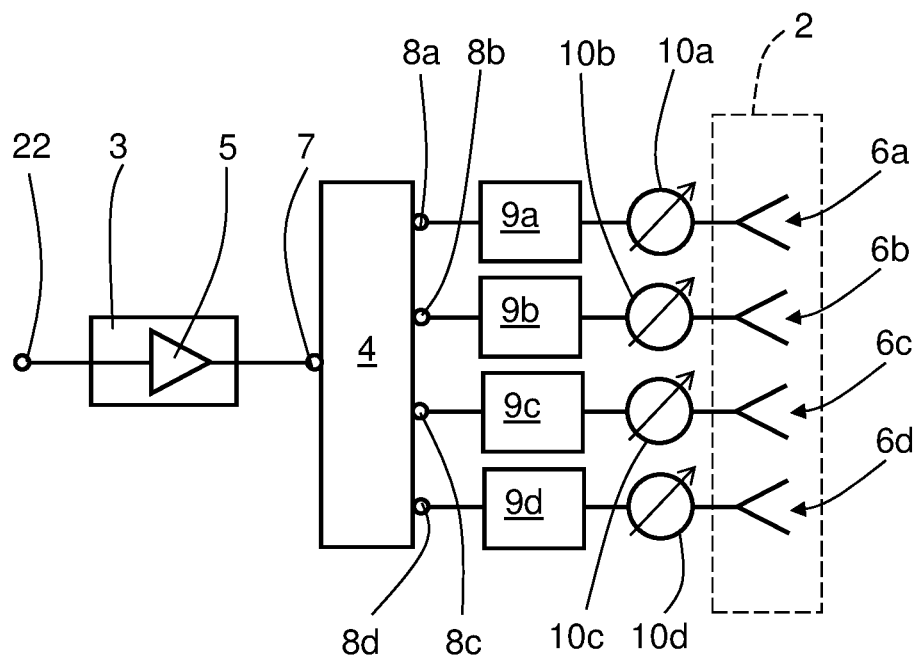
FIG. 2 shows a schematic view of an arrangement according to a first example of the present disclosure.

With reference to FIG. 1 and FIG. 2, FIG. 2 illustrating a first example, there is a node 1 in a wireless communication network, constituting a wireless communication network node 1 that comprises an antenna arrangement 2, a radio arrangement 3, a power splitter arrangement 4 and a power amplifier 5. The antenna arrangement 2 comprises at least one antenna device, here four antenna devices 6a, 6b, 6c, 6d are shown; a first antenna device 6a, a second antenna device 6b, a third antenna device 6c and a fourth antenna device 6d. Here, the power amplifier 5 is comprised in the radio arrangement 3, the radio arrangement 3 having an input port 22.

According to the present disclosure, the power amplifier 5 is connected to an input port 7 of the power splitter arrangement 4, where the power splitter arrangement 4 further comprises four output ports 8a, 8b, 8c, 8d; a first output port 8a connected to a first multi-band filter 9a, a second output port 8b connected to a second multi-band filter 9b, a third output port 8c connected to a third multi-band filter 9c and a fourth output port 8d connected to a fourth multi-band filter 9d. Each multi-band-filter 9a, 9b, 9c, 9d is arranged for handling at least two frequency bands $B_1$, $B_2$.

Each multi-band-filter 9a, 9b, 9c, 9d is connected to a corresponding antenna device 6a, 6b, 6c, 6d via a corresponding phase shifter 10a, 10b, 10c, 10d. More in detail, the first multi-band filter 9a is connected to the first antenna device 6a via a first phase shifter 10a, the second multi-band filter 9b is connected to the second antenna device 6b via a second phase shifter 10b, the third multi-band filter 9c is connected to the third antenna device 6c via a third phase shifter 10c, and the fourth multi-band filter 9d is connected to the fourth antenna device 6d via a fourth phase shifter 10d.

The multi-band-filters 9a, 9b, 9c, 9d are separated from the radio arrangement 3 and located after the power splitter arrangement 4 such that the power per filter is reduced; here each multi-band-filter 9a, 9b, 9c, 9d will handle a fourth of the power output from the power amplifier 5, except losses. In this way it is possible to have one multi-band filter per antenna device even though the antenna arrangement 2 is in the form of a passive antenna array with one single radio arrangement 3. By connecting one multi-band filter per antenna device, frequency selective antenna devices are obtained.

Figure 3:
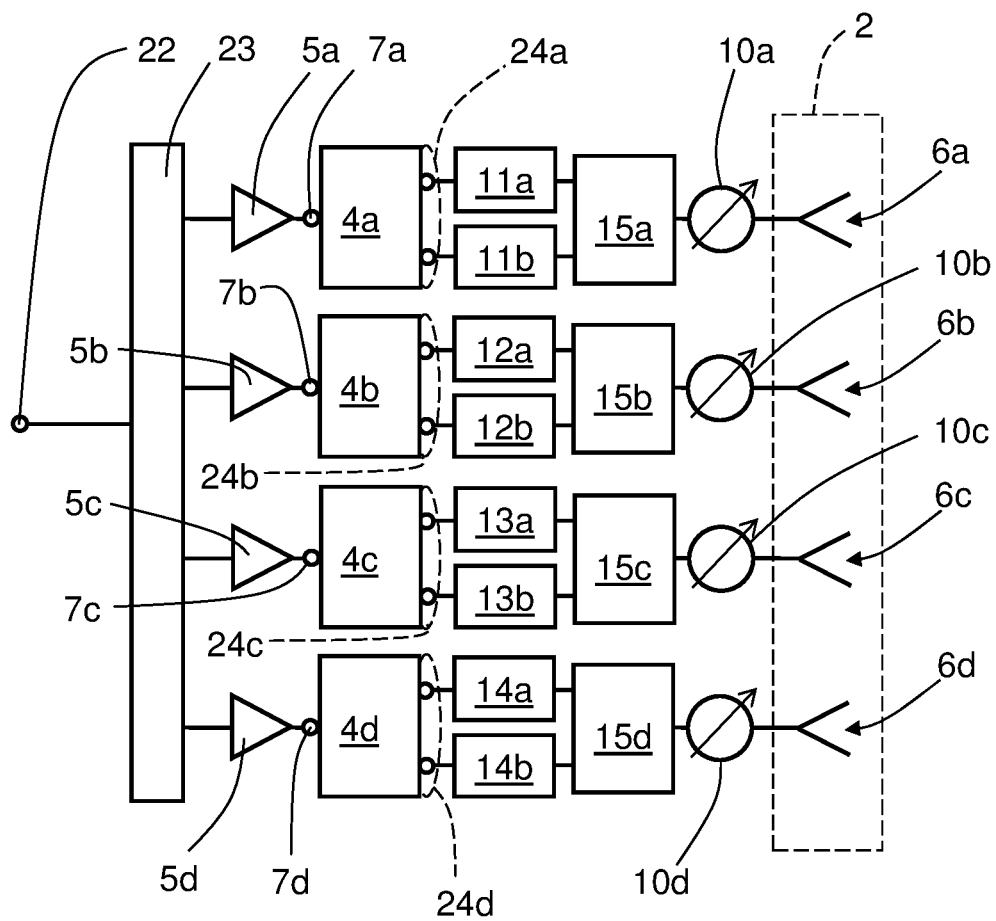
FIG. 3 shows a schematic view of an arrangement according to a second example of the present disclosure.

In order to reduce the power per filter even further, it is possible to use the architecture illustrated in FIG. 3. In this second example, there are two multi-band filters per antenna device. More in detail, there is a radio arrangement 23 having four outputs connected to a corresponding first power amplifier 5a, second power amplifier 5b, third power amplifier 5c and fourth power amplifier 5d. The power amplifiers 5a, 5b, 5c, 5d are in this example separate from the radio arrangement 23. Although not shown, the radio arrangement 23 could be a combination of a radio arrangement with one output and a four-way power splitter.

The first power amplifier 5a is connected to an input port 7a of a first power splitter arrangement 4a, where the power splitter arrangement 4a further comprises two output ports 24a connected to two corresponding multi-band filters 11a, 11b, forming a first pair of multi-band filters 11a, 11b. The multi-band filters 11a, 11b are connected to a first power combining arrangement 15a that is arranged to combine signals from the multi-band filters 11a, 11b and to feed a combined signal to a corresponding first antenna device 6a via a first phase shifter 10a.

The other power amplifiers 5b, 5c, 5d are in a corresponding manner connected to input ports 7b, 7c, 7d of a corresponding, second power splitter arrangement 4b, third power splitter arrangement 4c and fourth power splitter arrangement 4d. Each of these power splitter arrangements 4b, 4c, 4d comprises two corresponding output ports 24b, 24c, 24d connected to two corresponding multi-band filters 12a, 12b; 13a, 13b; 14a, 14b such that a second pair of multi-band filters 12a, 12b connected to a second power combining arrangement 15b, third pair of multi-band filters 13a, 13b connected to a third power combining arrangement 15c and fourth pair of multi-band filters 14a, 14b connected to a fourth power combining arrangement 15d are formed.

Each one of these power combining arrangements 15b, 15c, 15d is arranged to combine signals from the corresponding multi-band filters 12a, 12b; 13a, 13b; 14a, 14b and to feed a respective combined signal to a corresponding second antenna device 6b via a second phase shifter 10b, third antenna device 6c via a third phase shifter 10c and fourth antenna device 6d via a fourth phase shifter 10d.

The power amplifiers are here shown separate from the radio arrangement 23, but it is of course conceivable to instead have one or more power amplifiers within the radio arrangement 23.

Figure 4:
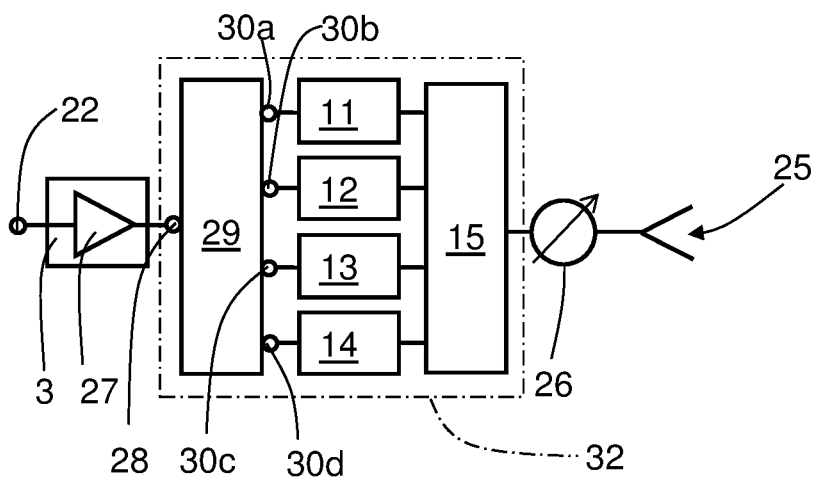
FIG. 4 shows a schematic view of an arrangement according to a third example of the present disclosure.

It is possible to use even more filters per antenna element by adding more filters, which is illustrated in a third example with reference to FIG. 4. Here a power amplifier 27 is connected to an input port 27 of a power splitter arrangement 29, where the power splitter arrangement 29 further comprises four output ports 30a, 30b, 30c, 30d; a first output port 30a connected to a first multi-band filter 11, a second output port 30b connected to a second multi-band filter 12, a third output port 30c connected to a third multi-band filter 13 and a fourth output port 30d connected to a fourth multi-band filter 14; generally as in the first example.

Here, however, each multi-band-filter 11, 12, 13, 14 is connected to a power combining arrangement 31 that is arranged to combine signals from the multi-band filters 11, 12, 13, 14, and to feed a combined signal to an antenna device 25 via a phase shifter 26.

It is to be noted that in arrangements where there is one power amplifier per antenna device, phase shifters do not have to used, and could be omitted.

The arrangement of having several power splitter arrangements, where each power splitter arrangement is connected to a set of least two parallel multi-band filters, where the output of each set of multi-band filters is combined in a corresponding power combining arrangement may be applied in several ways and combinations. It may for example be applied to the arrangement according to the first example in any suitable form. For example, each multi-band-filter 9a, 9b, 9c, 9d in FIG. 2 may be exchanged with an arrangement within the dashed-dotted frame 32 in FIG. 4, however with any suitable number of power splitter arrangement ports/power combining arrangement ports and corresponding multi-band-filters.

Figure 5:
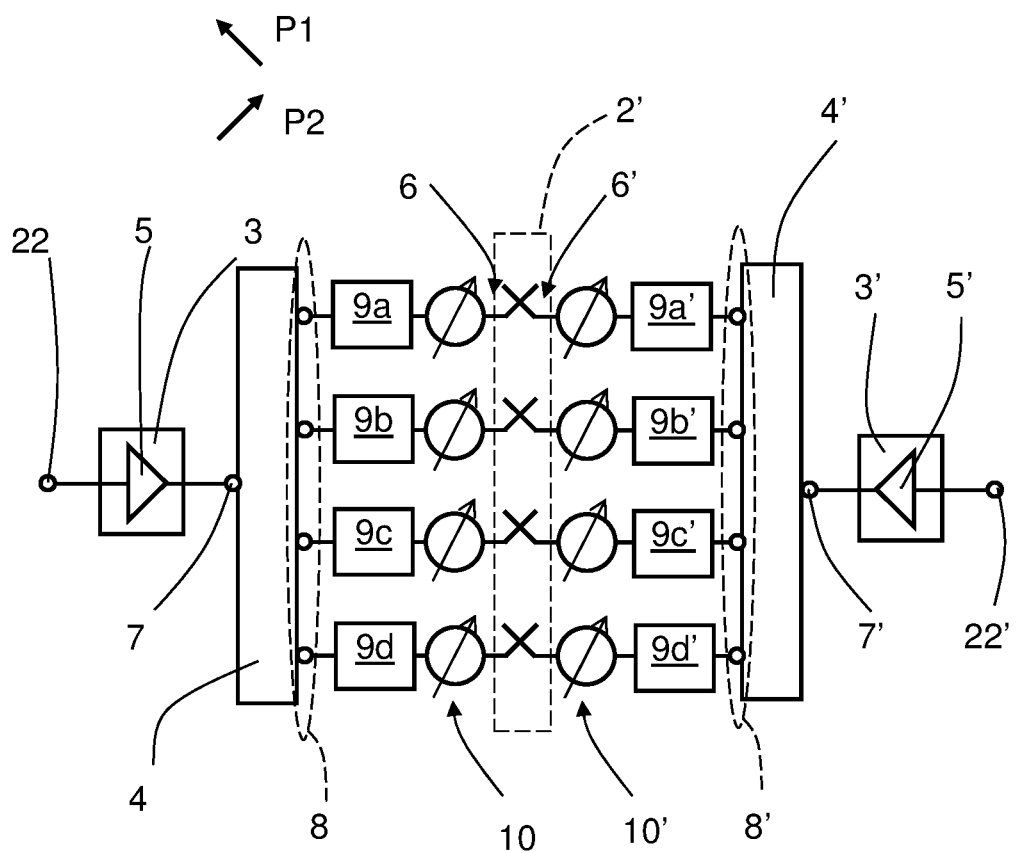
FIG. 5 shows a schematic view of an arrangement according to a fourth example of the present disclosure.

In a fourth example with reference to FIG. 5, the arrangement according to FIG. 2 is duplicated such that the number of antenna devices and the number of filters are duplicated in order to reduce the power per multi-band filter even further, such that two different sets of antenna devices are obtained, the sets having mutually orthogonal polarization directions. No additional power splitting and combining arrangements are needed, while the increased number of antennas devices will increase the antenna area. The fourth example thus corresponds to a dual polarized version of the first example.

More in detail, there is a first power amplifier 5, a second power amplifier 5', a first power splitter arrangement 4, and a second power splitter arrangement 4'. The first power amplifier 5 is connected to an input port 7 of the first power splitter arrangement 4, and the output ports 8 of the first power splitter arrangement 4 are connected to a first set of antenna devices 6 of a combined antenna arrangement 2' via corresponding multi-band filters 9a, 9b, 9c, 9d and phase shifters 10.

Correspondingly, the second power amplifier 5' is connected to an input port 7' of the second power splitter arrangement 4', where the output ports 8' of the second power splitter arrangement 4' are connected to a second set of antenna devices 6' of the combined antenna arrangement 2' via corresponding multi-band filters 9a', 9b', 9c', 9d' and phase shifters 10'. The first set of antenna devices 6 comprises antenna devices of a first polarization P1 and the second set of antenna devices 6' comprises antenna devices of a second polarization P2, where the first polarization P1 is orthogonal to the second polarization P2. The first polarization P1 and the second polarization P2 are illustrated as having opposing 45° tilt. This is of course only an example, any orientations are conceivable but the polarizations P1, P2 should be mutually orthogonal.

Figure 6:
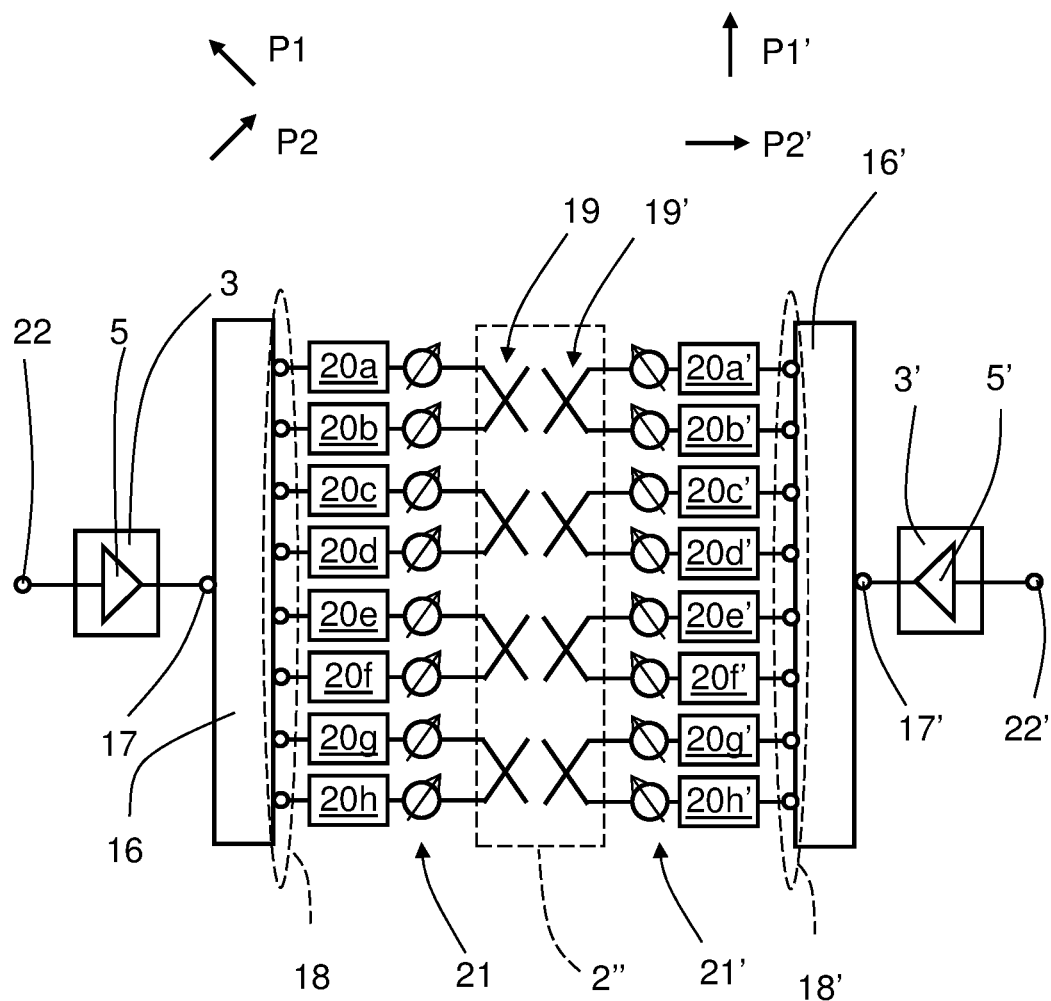
FIG. 6 shows a schematic view of an arrangement according to a fifth example of the present disclosure.

In a fifth example with reference to FIG. 6, there is a similar arrangement where, however, the first set of antenna devices comprises antenna devices of both the first polarization P1 and the second polarization P2, and where the second set of antenna devices 19 comprises antenna devices of both the first polarization P1 and the second polarization P2.

More in detail, there is a first power amplifier 5, a second power amplifier 5', a first power splitter arrangement 16 and a second power splitter arrangement 16'. Here, the power amplifiers 5, 5' are comprised in corresponding radio arrangements 3, 3' the radio arrangements 3, 3' having corresponding input ports 22, 22'. The first power amplifier 5 is connected to an input port 17 of the first power splitter arrangement 16, and output ports 18 of the first power splitter arrangement 16 are connected to a first set of antenna devices 19 of a combined antenna arrangement 2" via corresponding multi-band filters 20a, 20b, 20c, 20d, 20e, 20f, 20g, 20h and phase shifters 21.

The second power amplifier 5' is connected to an input port 17' of the second power splitter arrangement 16', and output ports 18' of the second power splitter arrangement 16' are connected to a second set of antenna devices 19' of the combined antenna arrangement 2" via corresponding multi-band filters 20a', 20b', 20c', 20d', 20e', 20f', 20g', 20h' phase shifters 21'. The first set of antenna devices 19 comprises antenna devices of both the first polarization P1 and the second polarization P2, and the second set of antenna devices 19' comprises antenna devices of both the first polarization P1 and the second polarization P2, where the first polarization P1 is orthogonal to the second polarization P2. In the example, the number of antennas devices of the first polarization P1 equals the number of antennas devices of the second polarization P2 for both sets of antenna devices 19, 19', although this is not necessary.

In this manner it is possible to obtain a first combined polarization P1' resulting from the first set of antenna devices 19 and a second combined polarization P2' resulting from the second set of antenna devices 19', where the first combined polarization P1' is orthogonal to a second combined polarization P2'. The first combined polarization P1' is illustrated as vertical and the second combined polarization P2' is illustrated as horizontal. This is of course only an example, any orientations are conceivable but the polarizations P1', P2' should be mutually orthogonal.

The losses in splitter, power combining arrangements and hybrids can be kept relatively small, and it is more or less required that the filters have similar phase response.

The present disclosure is not limited to the above, but may vary within the scope of the appended claims. For example, there need not be any phase shifters. In case there are phase shifters, these should be designed to match the frequencies that are used, suitably the frequencies of the multi-band filters. For example, suitably the phase shifters are of the type true time delay.

The polarizations may have any directions, but should always be orthogonal.

When terms like orthogonal and parallel are used, these terms are not to be interpreted as mathematically exact, but within what is practically obtainable.

The polarizations P1, P2 are shown to be perpendicular to the schematically indicated antenna devices 6a, 6b, 6c, 6d; 25, 6, 6'; 19, 19' which is the case for antenna elements in the form of slots, but this is only by way of example. For dipole antenna elements, the polarizations P1, P2 are parallel to the antenna elements, and for patch antenna elements, the polarization runs in a direction along the patch in dependence of its feeding.

Combinations of the principles provided in the examples are of course possible, as mentioned for the third example and the first example.

A radio arrangement is normally comprised by many separate parts such as one or more oscillators, digital-to-analog converters and/or mixers, and there may be more than one radio arrangement.

Each multi-band-filter 9a, 9b, 9c, 9d is arranged for at least two frequency bands $B_1$, $B_2$, and of course three or more frequency bands are conceivable.

Multi-band filters may for example be used to separate frequency components of a signal and pass certain selected frequency ranges while filtering out other frequency ranges. This divides the frequency spectrum into a series of pass bands and stop bands separated by transition bands. Said frequency bands $B_1$, $B_2$ may be constituted by of pass bands and/or stop bands. Each multi-band-filter 9a, 9b, 9c, 9d being arranged for at least two frequency bands $B_1$, $B_2$ thus means that each multi-band-filter 9a, 9b, 9c, 9d comprises pass bands and/or stop bands for said frequency bands $B_1$, $B_2$.

When it is mentioned that the multi-band-filters 9a, 9b, 9c, 9d are separated from the radio arrangement 3, it is to be noted that this separation at least refers to a functional separation. The multi-band-filters 9a, 9b, 9c, 9d and the radio arrangement 3 could be positioned within the same housing, or in different housings positioned at different places.

In the drawings, the same reference number has been used in different drawings for recurring details.

Generally, the present disclosure relates to a wireless communication network node 1 comprising at least one antenna arrangement 2, at least one radio arrangement 3, at least one power splitter arrangement 4 and at least one power amplifier 5, where each antenna arrangement 2 in turn comprises at least one antenna device 6a, 6b, 6c, 6d, and where each power splitter arrangement 4 comprises an input port 7 and at least two output ports 8a, 8b, 8c, 8d. Each of said at least one power amplifier 5 is connected to a corresponding input port 7, and where, for each power splitter arrangement 4, at least two output ports 8a, 8b, 8c, 8d are connected to at least one corresponding antenna device 6a, 6b, 6c, 6d via a corresponding multi-band filter 9a, 9b, 9c, 9d for each of said output ports 8a, 8b, 8c, 8d, where each multi-band filter 9a, 9b, 9c, 9d is arranged for at least two frequency bands $B_1$, $B_2$.

According to an example, at least two multi-band filters 9a, 9b, 9c, 9d are connected to said at least one antenna device 6a, 6b, 6c, 6d via a corresponding phase shifter 10a, 10b, 10c, 10d.

According to an example, at least two multi-band filters 11a, 11b; 12a, 12b; 13a, 13b; 14a, 14b; 11, 12, 13, 14 are connected to a corresponding antenna device 6a, 6b, 6c, 6d; 25 via a corresponding power combining arrangement 15a, 15b, 15c, 15d; 15.

According to an example, the communication network node 1 comprises a first power amplifier 5, a second power amplifier 5', a first power splitter arrangement 4, 16 and a second power splitter arrangement 4', 16', where the first power amplifier 5 is connected to an input port 7, 17 of the first power splitter arrangement 4, 16 and where the output ports 8, 18 of the first power splitter arrangement 4, 16 are connected to a first set of antenna devices 6, 19 of a combined antenna arrangement 2', 2" via corresponding multi-band filters 9a, 9b, 9c, 9d; 20a, 20b, 20c, 20d, 20e, 20f, 20g, 20h and phase shifters 10, 21, and where the second power amplifier 5' is connected to an input port 7', 17' of the second power splitter arrangement 4', 16', where the output ports 8', 18' of the second power splitter arrangement 4', 16' are connected to a second set of antenna devices 6', 19' of the combined antenna arrangement 2', 2" via corresponding multi-band filters 9a', 9b', 9c', 9d'; 20a', 20b', 20c', 20d', 20e', 20f', 20g', 20h' and phase shifters 10', 21', the combined antenna arrangement 2', 2" comprising antenna devices of a first polarization P1 and a second polarization P2, where first polarization P1 is orthogonal to the second polarization P2.

According to an example, the first set of antenna devices 6 comprises antenna devices of the first polarization P1 only, and where the second set of antenna devices 6' is comprises antenna devices of the second polarization P2 only.

According to an example, the first set of antenna devices 19 comprises antenna devices of both the first polarization P1 and the second polarization P2, and where the second set of antenna devices 19' comprises antenna devices of both the first polarization P1 and the second polarization P2.

According to an example, a first combined polarization P1' resulting from the first set of antenna devices 19 is orthogonal to a second combined polarization P2' resulting from the second set of antenna devices 19'.

According to an example, at least one power amplifier 5 is comprised in a corresponding radio arrangement 3.

According to an example, each radio arrangement 3 comprises one or more oscillators, digital-to-analog converters and/or mixers.

According to an example, one or more multi-band filters 9a, 9b, 9c, 9d are arranged to separate frequency components of a signal and pass certain selected frequency ranges while filtering out other frequency ranges, thus being arranged to divide a frequency spectrum into a series of pass bands and stop bands separated by transition bands.

The invention claimed is:

1. A wireless communication network node comprising:
   at least one antenna arrangement,
   at least one radio arrangement,
   at least one power splitter arrangement, and
   at least one power amplifier,
   where each antenna arrangement in turn comprises at least one antenna device, and where each power splitter arrangement comprises an input port and at least two output ports, wherein each of said at least one power amplifier is connected to a corresponding input port, and where, for each power splitter arrangement, the at least two output ports of each power splitter arrangement are connected to at least one corresponding antenna device via a corresponding multi-band filter for each of the at least two output ports of the each power splitter arrangement, where each multi-band filter is arranged for at least two frequency bands, and
   wherein the wireless communication network node comprises a first power amplifier, a second power amplifier, a first power splitter arrangement, a second power splitter arrangement, where the first power amplifier is connected to an input port of the first power splitter arrangement and where the output ports of the first power splitter arrangement are connected to a first set of antenna devices of a combined antenna arrangement via corresponding multi-band filters for each of said output ports and phase shifters, and where the second power amplifier is connected to an input port of the second power splitter arrangement, where the output ports of the second power splitter arrangement are connected to a second set of antenna devices of the combined antenna arrangement via corresponding multi-band filters for each of said output ports and phase shifters, the combined antenna arrangement comprising antenna devices of a first polarization and a second polarization, where first polarization is orthogonal to the second polarization.

2. A wireless communication network node according to claim 1, wherein at least two multi-band filters are connected to said at least one antenna device via a corresponding phase shifter.

3. A wireless communication network node according to claim 1, wherein at least two multi-band filters are connected to a corresponding antenna device via a corresponding power combining arrangement.

4. A wireless communication network node according to claim 1, wherein the first set of antenna devices comprises antenna devices of the first polarization only, and where the second set of antenna devices is comprises antenna devices of the second polarization only.

5. A wireless communication network node according to claim 1, wherein the first set of antenna devices comprises antenna devices of both the first polarization and the second polarization, and where the second set of antenna devices comprises antenna devices of both the first polarization and the second polarization.

6. A wireless communication network node according to claim 5, wherein a first combined polarization resulting from the first set of antenna devices is orthogonal to a second combined polarization resulting from the second set of antenna devices.

7. A wireless communication network node according to claim 1, wherein at least one power amplifier is comprised in a corresponding radio arrangement.

8. A wireless communication network node according to claim 1, wherein each radio arrangement comprises one or more oscillators, digital-to-analog converters and/or mixers.

9. A wireless communication network node according to claim 1, wherein one or more multi-band filters are arranged to separate frequency components of a signal and pass certain selected frequency ranges while filtering out other frequency ranges, thus being arranged to divide a frequency spectrum into a series of pass bands and stop bands separated by transition bands.

10. A base station of a communication network, comprising:
   at least one antenna arrangement,
   at least one radio arrangement,
   at least one power splitter arrangement, and
   at least one power amplifier,
   where each antenna arrangement in turn comprises at least one antenna device, and where each power splitter arrangement comprises an input port and at least two output ports, wherein each of said at least one power amplifier is connected to a corresponding input port, and where, for each power splitter arrangement, the at least two output ports of each power splitter arrangement are connected to at least one corresponding antenna device via a corresponding multi-band filter for each of the at least two output ports of the each power splitter arrangement, where each multi-band filter is arranged for at least two frequency bands, and
   wherein the base station comprises a first power amplifier, a second power amplifier, a first power splitter arrangement, a second power splitter arrangement, where the first power amplifier is connected to an input port of the first power splitter arrangement and where the output ports of the first power splitter arrangement are connected to a first set of antenna devices of a combined antenna arrangement via corresponding multi-band filters for each of said output ports and phase shifters, and where the second power amplifier is connected to an input port of the second power splitter arrangement, where the output ports of the second power splitter arrangement are connected to a second set of antenna devices of the combined antenna arrangement via corresponding multi-band filters for each of said output ports and phase shifters, the combined antenna arrangement comprising antenna devices of a first polarization and a second polarization, where first polarization is orthogonal to the second polarization.

11. A base station according to claim 10, wherein at least two multi-band filters are connected to said at least one antenna device via a corresponding phase shifter.

12. A base station according to claim 10, wherein at least two multi-band filters are connected to a corresponding antenna device via a corresponding power combining arrangement.

13. A base station according to claim 10, wherein the first set of antenna devices comprises antenna devices of the first polarization only, and where the second set of antenna devices is comprises antenna devices of the second polarization only.

14. A base station according to claim 10, wherein the first set of antenna devices comprises antenna devices of both the first polarization and the second polarization, and where the second set of antenna devices comprises antenna devices of both the first polarization and the second polarization.

15. A base station according to claim 14, wherein a first combined polarization resulting from the first set of antenna devices is orthogonal to a second combined polarization resulting from the second set of antenna devices.

16. A base station according to claim 10, wherein at least one power amplifier is comprised in a corresponding radio arrangement.

17. A base station according to claim 10, wherein each radio arrangement comprises one or more oscillators, digital-to-analog converters and/or mixers.

18. A base station to claim 10, wherein one or more multi-band filters are arranged to separate frequency components of a signal and pass certain selected frequency ranges while filtering out other frequency ranges, thus being arranged to divide a frequency spectrum into a series of pass bands and stop bands separated by transition bands.

\* \* \* \* \*